United States Patent
Liu et al.

(10) Patent No.: US 11,860,216 B2
(45) Date of Patent: Jan. 2, 2024

(54) FAULT ARC SIGNAL DETECTION METHOD USING CONVOLUTIONAL NEURAL NETWORK

(71) Applicant: QINGDAO TOPSCOMM COMMUNICATION CO., LTD, Shandong (CN)

(72) Inventors: Zhen Liu, Shandong (CN); Jianhua Wang, Shandong (CN); Yue Ma, Shandong (CN); Huarong Wang, Shandong (CN)

(73) Assignee: QINGDAO TOPSCOMM COMMUNICATION CO., LTD, Shandong (CN)

( * ) Notice: Subject to any disclaimer, the term of this patent is extended or adjusted under 35 U.S.C. 154(b) by 0 days.

(21) Appl. No.: 17/920,383

(22) PCT Filed: Dec. 25, 2020

(86) PCT No.: PCT/CN2020/139396
§ 371 (c)(1),
(2) Date: Oct. 20, 2022

(87) PCT Pub. No.: WO2021/212891
PCT Pub. Date: Oct. 28, 2021

(65) Prior Publication Data
US 2023/0160942 A1 May 25, 2023

(30) Foreign Application Priority Data

Apr. 22, 2020 (CN) .......................... 202010001455.0
Dec. 18, 2020 (CN) .......................... 202011505343.5

(51) Int. Cl.
*G06N 3/02* (2006.01)
*G06N 3/08* (2023.01)
(Continued)

(52) U.S. Cl.
CPC ....... *G01R 31/1272* (2013.01); *G01R 23/165* (2013.01); *G06N 3/048* (2023.01); *G06N 3/0464* (2023.01); *G06N 3/08* (2013.01)

(58) Field of Classification Search
CPC .. G01R 31/1272; G01R 31/52; G01R 31/086; G01R 31/14; G01R 31/085; G01R 31/08;
(Continued)

(56) References Cited

U.S. PATENT DOCUMENTS 8,744,637 B1 * 6/2014 Maragal ................. H02H 3/066
702/77
11,175,348 B2 * 11/2021 Broeckmann ........ G01R 31/083
(Continued)

FOREIGN PATENT DOCUMENTS

CN  102749533 A  10/2012
CN  104237737 A  12/2014
(Continued)

OTHER PUBLICATIONS

The 1st Office Action daed Apr. 21, 2022 regarding the Chinese priority patent application CN202011505343.5. English Translation of the 1st Office Action Provided by http://globaldossier.uspto.gov.
(Continued)

Primary Examiner — Jeffrey P Aiello
(74) Attorney, Agent, or Firm — Yue (Robert) Xu; Apex Attorneys at Law, LLP

(57) ABSTRACT

A fault arc signal detection method using a convolutional neural network, comprising: enabling a sampling signal subjected to analog-digital conversion to respectively pass through three different band-pass filters; respectively extracting a time-domain feature and a frequency-domain feature from a half wave output of each filter; constructing a two-dimensional feature matrix by means of extracted time-frequency feature vectors from the output of each filter,
(Continued)

and stacking the feature matrices corresponding the outputs of the three filters to construct a three-dimensional matrix for each half wave; and processing a multi-channel feature matrix by using a multi-channel two-dimensional convolutional neural network, and determining, according to the output result of the neural network, whether the half wave is an arc. The detection method based on the convolutional neural network has higher accuracy and reliability in recognizing a fault arc half wave, can implement targeted training for different load conditions, and is self-adaptive.

9 Claims, 7 Drawing Sheets

(51) Int. Cl.
*G01R 23/165* (2006.01)
*G01R 23/02* (2006.01)
*G01R 31/08* (2020.01)
*G01R 31/12* (2020.01)
*G06N 3/048* (2023.01)
*G06N 3/0464* (2023.01)

(58) Field of Classification Search
CPC ............ G06N 3/045; G06N 3/08; G06N 3/04; G06N 3/084; G06N 20/00; G06N 3/02; G06N 3/048; G06N 3/0464; G06N 3/063; G06N 3/043; G06F 17/16; G06F 18/214; G05B 19/4184; H04B 17/29
USPC ......... 361/42; 702/17, 58, 188–189; 706/15, 706/22, 25, 900
See application file for complete search history.

(56) References Cited

U.S. PATENT DOCUMENTS

| | | |
|---|---|---|
| 2006/0203401 A1 | 9/2006 | Kojori et al. |
| 2009/0168277 A1 | 7/2009 | Changali et al. |
| 2014/0347065 A1 | 11/2014 | Zach |
| 2020/0342893 A1* | 10/2020 | Choo ...................... G10L 25/30 |

FOREIGN PATENT DOCUMENTS

| | | | | |
|---|---|---|---|---|
| CN | 104237737 A | * | 12/2014 | |
| CN | 105223476 A | | 1/2016 | |
| CN | 105492913 A | | 4/2016 | |
| CN | 107340459 A | | 11/2017 | |
| CN | 109298291 A | | 2/2019 | |
| CN | 109508908 A | | 3/2019 | |
| CN | 110223195 A | | 9/2019 | |
| CN | 110287320 A | * | 9/2019 | ............ G06F 16/35 |
| CN | 110320452 A | | 10/2019 | |
| CN | 110376497 A | | 10/2019 | |
| CN | 110618353 A | * | 10/2019 | ........... G01R 31/086 |
| CN | 110618353 A | | 12/2019 | |
| FR | 2992733 A1 | * | 1/2014 | ........... G01R 31/086 |
| WO | 2019182166 A1 | | 9/2019 | |
| WO | WO-2019166601 A1 | * | 9/2019 | ........... G06N 3/0454 |

OTHER PUBLICATIONS

International Search Report for PCT/CN2020/139396 dated Apr. 2, 2021, ISA/CN.

* cited by examiner

FAULT ARC SIGNAL DETECTION METHOD USING CONVOLUTIONAL NEURAL NETWORK

The present application is the national phase of International Patent Application No. PCT/CN2020/139396, titled "FAULT ARC SIGNAL DETECTION METHOD USING CONVOLUTIONAL NEURAL NETWORK", filed on Dec. 25, 2020, which claims priority to Chinese Patent Application No. 202011505343.5, titled "FAULT ARC SIGNAL DETECTION METHOD USING CONVOLUTIONAL NEURAL NETWORK", filed on Dec. 18, 2020 with the Chinese Patent Office and Chinese Patent Application No. 202010001455.0, titled "FAULT ARC SIGNAL DETECTION METHOD USING CONVOLUTIONAL NEURAL NETWORK", filed on Apr. 22, 2020 with the Chinese Patent Office, all of which are incorporated herein by reference in their entireties.

FIELD

The present disclosure relates to the technical field of fault arc detection, and in particular to a method for detecting a fault arc signal by using a convolutional neural network.

BACKGROUND

Nowadays, electrical fires account for a high proportion of fire accidents. An arc fault is one of the main causes of the electrical fires. The fault arc is usually caused by aging and breakage of insulation of lines and equipment, or poor electrical connections. When an arc fault occurs, the arc may release high heat which can easily cause fire. Based on the type of the arc fault, the arc fault includes a series arc fault or a parallel arc fault. In a case of the parallel arc fault, the current is large, and the conventional overcurrent protection device and short-circuit protection device may perform partially protection. In a case of the series arc fault, the current is abnormal and is lower than a protection threshold, and the conventional overcurrent protection device cannot effectively detect the fault arc and protect a circuit.

With the conventional arc detection method, a threshold is set for an extracted feature value to determine whether a half wave is an arc. Due to the diversity of loads in the actual electricity environment, different thresholds are set for different loads. Therefore, the conventional arc detection method cannot adapt to different load environments, and it is still required to improve the performance of the conventional arc detection method.

SUMMARY

In view of the defects of the conventional technology, a method for detecting a fault arc signal by using a convolutional neural network is provided according to the embodiments of the present disclosure. Compared with the conventional detection method in which a threshold is set, the method according to the present disclosure has higher accuracy and higher reliability.

In a first aspect, a method for detecting a fault arc signal by using a convolutional neural network is provided in an embodiment of the present disclosure. The method includes: S1, filtering, by using three band-pass filters with different pass-bands, a sampled current signal to extract time-frequency eigenvectors; S2, constructing a three-dimensional matrix based on the time-frequency eigenvectors; S3, constructing a two-dimensional convolutional neural network model, and training the two-dimensional convolutional neural network model to obtain a two-dimensional convolutional neural network model with best performance; S4, performing, by using the two-dimensional convolutional neural network model with the best performance, an online determination on the three-dimensional matrix to obtain an arc detection result, where an arc detection result of 0 indicates that no arcing occurs, and an arc detection result of 1 indicates that an arcing occurs; S5, counting the number of fault half-waves in an observation time period $\Delta T$ based on the arc detection result; and S6, comparing the number of the fault half-waves in the observation time period $\Delta T$ with a threshold, performing a tripping operation in a case that the number of the fault half-waves exceeds the threshold, and performing no operation in a case that the number of the fault half-waves does not exceed the threshold.

In step S1, an AD conversion is performed on the sampled current signal, and the sampled signal passes through the three band-pass filters with different pass-bands. The pass-bands respectively range from 500 KHZ to 50 MHZ, from 50 MHZ to 100 MHZ, and from 100 MHZ to 200 MHZ. 40 time-frequency eigenvectors are extracted from each of output signals of the filters, and each of the eigenvector is a 300-dimensional eigenvector.

In the method, in performing time-frequency feature extraction on the filtered signal, segmentation processing is performed. A 10 ms half-wave is divided evenly into 300 segments, and a waveform of each of the segments is analyzed and processed. Extracted similar eigenvalues of each of the segments form a time series.

Specifically, each of the time-frequency eigenvectors includes a time-domain feature and a frequency-domain feature, and the time-domain feature includes a time dispersion, an amplitude dispersion, and the number of waveforms. In extracting the time-domain feature, for each of the waveforms, the waveform is preprocessed, a non-local extreme point of the waveform is eliminated, remaining sampling points are connected sequentially to obtain a new waveform, and the time-domain feature is extracted based on the new waveform.

The time dispersion is calculated by using the following equation:

$$\text{Time dispersion} = \frac{|T_2 - T_1| + |T_3 - T_2| + |T_4 - T_3|}{|T_1| + |T_2| + \ldots + |T_4|}$$

where $T_i$ represents a time interval between two adjacent minimum values.

The amplitude dispersion is calculated by using the following equation:

$$\text{Amplitude dispersion} = \frac{|V_{FH} - V_{DF}| + |V_{HJ} - V_{FH}| + |V_{JP} - V_{HJ}|}{|V_{DE}| + |V_{FG}| + \ldots + |V_{MP}|}$$

where each of a difference between $V_{FH}$ and $V_{DF}$, a difference between $V_{HJ}$ and $V_{FH}$ and a difference between $V_{HJ}$ and $V_{FH}$ in the numerator represents an amplitude difference between two adjacent minimum points, and each of $V_{DE}$, $V_{FG}$ and $V_{MP}$ in the denominator represents an amplitude difference between a minimum point and a maximum point adjacent to the minimum point.

The number of waveforms is calculated as follows. Assuming that y represents a sequence of the new waveform obtained by preprocessing the waveform, the number N of the waveforms is calculated by using the following equation:

$$N = \left\lfloor \frac{\text{length}(y) - 1}{2} \right\rfloor$$

where length(y) represents a sequence length of the preprocessed waveform, and $\lfloor g \rfloor$ represents a rounding down operation. The above calculation is performed on 300 segments of each of the half-waves, and extracted 300 eigenvalues chronologically form a 300-dimensional vector.

In the method, a frequency-domain feature of the filtered signal is extracted by: step 1, assuming that L represents a length of data in each of time period, and performing a 1024-point FFT operation on the data in each of the time period for $$M = \left\lfloor \frac{L}{1024} \right\rfloor$$

times; step 2, selecting 37 feature frequency points from an FFT operation result, obtaining a vector based on M FFT operation results, and performing median filtering respectively on M-dimensional eigenvectors at the 37 frequency points; step 3, summing the 37 filtered M-dimensional eigenvectors to obtain 37 eigenvalues; and step 4, performing the above operations on 300 time periods in each of the half-waves, and obtaining a eigenvector based on of the eigenvalues in different time periods in a time sequence.

In the method, before performing processing by using the neural network, it is required to perform normalization on the extracted eigenvectors. The normalization is performed by using the following equation:

$$x[n] = \frac{x[n] - \min(X)}{\max(X) - \min(X)}$$

where x[n] represents an n-th element in an eigenvector, and x[n] represents an element after normalization; X represents an eigenvector before normalization; max (X) represents a maximum element in the eigenvector X; and min(X) represents a minimum element in the eigenvector X.

In the method, the eigenvectors are spliced. 40 eigenvectors are extracted from the output of each of the three filters, and the eigenvectors corresponding to each of the filters form a 40*300 matrix. Further, matrices corresponding to the three filters are stacked to form a 40*300*3 three-dimensional feature matrix, where the last dimension 3 represents the number of channels.

In an embodiment, a topology structure of the convolutional neural network used in the detection method mainly includes two convolution layers. A first convolution layer has three 5*5*3 convolution kernels, where the number 3 in 5*5*3 represents the number of channels. A second convolution layer has five 3*3*3 convolution kernels. The topology structure of the convolutional neural network further includes a MaxPooling2D pooling layer, a Dropout layer, and a Flatten layer that stretches a multi-dimensional output of a convolution layer to a one-dimensional vector. The one-dimensional vector is inputted to a fully connected layer. The fully connected layer includes two layers which respectively have 64 neurons and 32 neurons. An output layer has one neuron.

In performing calculation in a convolution layer, an input matrix is multiplied by corresponding points in a convolution kernel of the convolution layer, then products are summed, and then a bias value is added. The calculation is performed by using the following equation:

$$y_n = \sum_{k=1}^{K} \sum_{i=1}^{M} \sum_{j=1}^{N} (x_{i,j,k} g a_{i,j,k}) + b_n$$

where K represents the number of channels, M represents the number of rows of a convolution kernel in each of the channels, N represents the number of columns of the convolution kernel in each of the channels, $y_n$ represents a convolution output result, $b_n$ represents a direct-current bias in a linear operation, $a_{i,j,k}$ represents a weighting coefficient in the linear operation, and $x_{i,j,k}$ represents an originally inputted feature element or an output result of a previous convolution layer.

Assuming that an original matrix is an A*B*K matrix and the convolution operation is performed with a stride of 1, then a (A−M+1)*(B−N+1) result is outputted after the above convolution operation. The number of the channels of the convolution operation result is determined by the number of the convolution kernels.

Dimensionality reduction is performed on the convolution result through the pooling layer. In the method, a MaxPooling2D pooling layer is used to extract a maximum value from data in an region in a channel. The pooling operation is performed by using the following equation:

$$a_n = \max(x_{i,j})$$

where $x_{i,j}$ represents an elements in a region covered by a pooling window, and an represents a pooling output result representing a maximum $x_{i,j}$ in the channel.

In an embodiment, the convolution layers and the fully connected layers adopt a ReLu activation function, which is expressed as:

relu(x)=max(0,x);

and the output layer adopts a sigmoid activation function, which is expressed as:

$$\text{sigmoid}(x) = \frac{1}{1 + e^{-x}}$$

The output layer outputs a probability value ranging from 0 and 1 by using the sigmoid activation function. A half-wave is determined as a normal half-wave or as a fault arc based on the probability value. For example, if 0.5 is set as a threshold, the half-wave is determined as an arc in a case that the probability value is greater than 0.5, and the half-wave is determined as a normal half-wave in a case that the probability value is less than 0.5.

In an embodiment, in the detection method, before the neural network model is used for determination, it is required to train the neural network model offline based on training data to obtain and save a model with best performance. Then, online determination is performed on the obtained feature matrix by using the trained model.

In an embodiment, in the detection method, experimental data labeled as normal data and experimental data labeled as arcing data are required for training the neural network. In collecting arcing experimental data in the laboratory, there may be a case in which data labeled as arcing data is collected and no arcing occurs, thus it is required to eliminate the mislabeled data in this case. In a series arc experiment, a voltage across an arc generator or a voltage across a carbonized cable is measured, then the mislabeled data is eliminated based on the measured voltage, that is, the data labeled as arcing data while no arcing occurring is eliminated. In a parallel arc experiment, a current at a position at which an arc occurs in a cable is measured, and then the data labeled as arcing data while no arcing occurring is eliminated based on the measured current.

With the detection method, it is determined whether a 10 ms half-wave is an arc. In a practical arc detection, it is required to comprehensively process a half-wave in an observation time period ΔT to determine whether an arcing occurs in this time period. Counting is performed by using the following equation:

$$N = \sum_{i=1}^{[\Delta T/10]} y_i$$

where $y_i$ represents a determination result of an i-th half-wave in the observation time period, a determination result equal to 0 indicates that the half-wave is a normal half-wave, and a determination result of equal to 1 indicates that an arcing occurs. The number of fault half-waves in the observation time period is obtained by summing vectors, and then is compared with a fault half-wave threshold corresponding to ΔT to determine whether to perform tripping operation.

Compared with the conventional method in which a single eigenvalue is obtained and then the single eigenvalue is compared with a threshold to determine a half-wave is a fault arc half-wave, with the method based on a convolutional neural network according to the present disclosure, a higher accuracy and higher reliability can be achieved in identifying a fault arc half-wave, and adaptability can be achieved in performing training for different load conditions.

BRIEF DESCRIPTION OF THE DRAWINGS

In order for a clearer illustration of technical solutions in the embodiments of the present disclosure or the conventional technology, accompanying drawings used in the description of the embodiments or the conventional technology are briefly introduced below.

DETAILED DESCRIPTION OF THE EMBODIMENTS

The technical solutions in the embodiments of the present disclosure are clearly and completely described below with reference to the accompanying drawings used in the embodiments of the present disclosure. Apparently, the described embodiments are a part, rather than all, of the embodiments of the present disclosure. Any other embodiments obtained by those of ordinary skill in the art from the embodiments of the present disclosure without any creative effort shall fall within the protection scope of the present disclosure.

It is to be understood that, when used in this specification and the appended claims, terms "comprise" and "include" (and variants thereof) indicate existence of described features, entireties, steps, operations, elements and/or components, and do not exclude existence or addition of one or more of other features, entireties, steps, operations, elements, components, and/or combinations thereof.

According to the conventional technology, when a fault arc occurs, a current signal in the circuit may be significantly distorted, and a voltage signal is similar to a normal voltage signal. Therefore, in the present disclosure, a current signal is sampled, then AD conversion is performed on the current signal, and then the current signal is analyzed to obtain features of various arc signals.

In addition, for the problems of the conventional arc detection method described in the background technology, with the solutions according to the present disclosure, an analog-to-digital conversion is performed on a sampled current signal, and then filtering is performed by using three filters with different pass-bands. For each of outputted half-wave signals after filtering, time-domain eigenvectors and frequency-domain eigenvectors of the half-wave are extracted. Eigenvectors corresponding to an output of a same filter are spliced to obtain a two-dimensional matrix. Feature matrices corresponding to the three filters are stacked to obtain a three-dimensional feature matrix. A two-class processing is performed on the three-dimensional feature matrix by using a two-dimensional convolutional neural network, and it is determined whether an arc occurs in the half-wave based on an outputted probability value. The number of half-waves of fault arcs occurring in an observation time period ΔT is counted, and is compared with a preset threshold. A tripping operation is performed in a case that the number of the half-waves of the fault arcs occurring in the observation time period ΔT exceeds the preset threshold, and no operation is performed in a case that the number of the half-waves of the fault arcs occurring in the observation time period ΔT does not exceed the preset threshold.

Hereinafter, the method for detecting a fault arc according to the present disclosure is described with reference to FIGS. 1 to 8.

Figure 1:
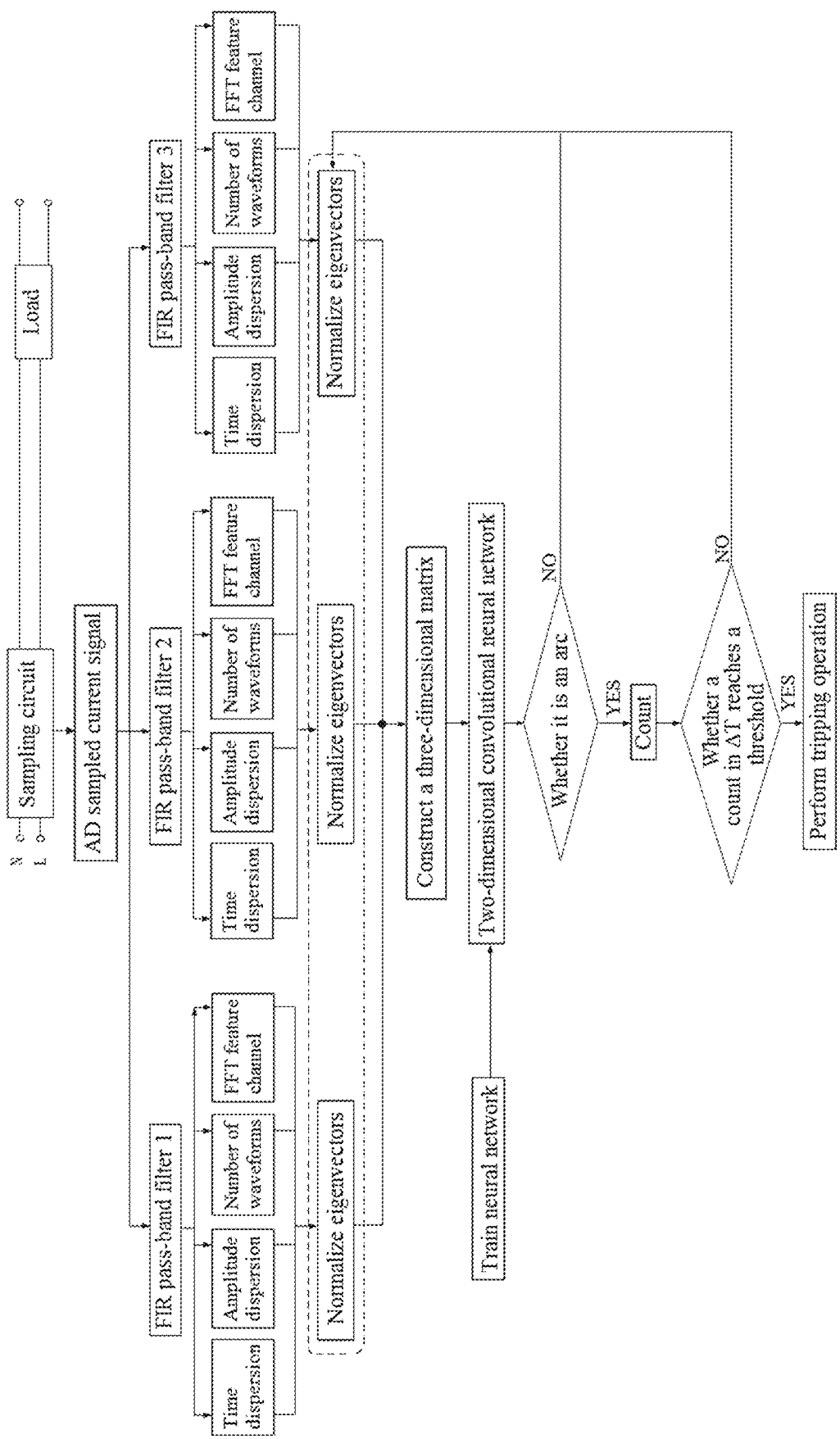
FIG. 1 is a flowchart of a method for detecting an arc by using a convolutional neural network according to the present disclosure.

FIG. 1 shows a flowchart of a method for detecting an arc based on a convolutional neural network according to the present disclosure. First, an analog-to-digital conversion is performed on a sampled current signal, and then the signal after the analog-to-digital conversion is filtered by three band-pass filters with different pass-bands. The pass-bands respectively range from 500 KHZ to 50 MHZ, from 50 MHZ to 100 MHZ, and from 100 MHZ to 200 MHZ. Each of filtered half-waves with a time length of 10 ms is equally divided into 300 segments, and an arc eigenvalue of a high-frequency signal in each of the segments is extracted respectively in a time domain and in a frequency domain. Eigenvalues of a same type of the 300 segments are arranged chronologically to form a 300-dimensional eigenvector. Then, eigenvectors of different types form a feature matrix. The feature matrix is processed by using a multi-channel two-dimensional convolutional neural network. Before using the neural network for online determination, it is required to train the neural network to obtain and save an optimal model. The number of fault half-waves in an observation time period ΔT is counted and then is compared with a preset threshold to determine whether to perform a tripping operation.

The above process is described in detail below.

In detecting an arc signal, since the arc signal is non-stationary, each of the half-wave signals is processed by time segments. Based on this idea, in a preferred embodiment, a 10 ms half-wave is divided into 300 segments, a time-domain feature and a frequency-domain feature of each of the segments are extracted, and eigenvalues extracted from the 300 segments are arranged chronologically to form a 300-dimensional eigenvector.

Figure 7:
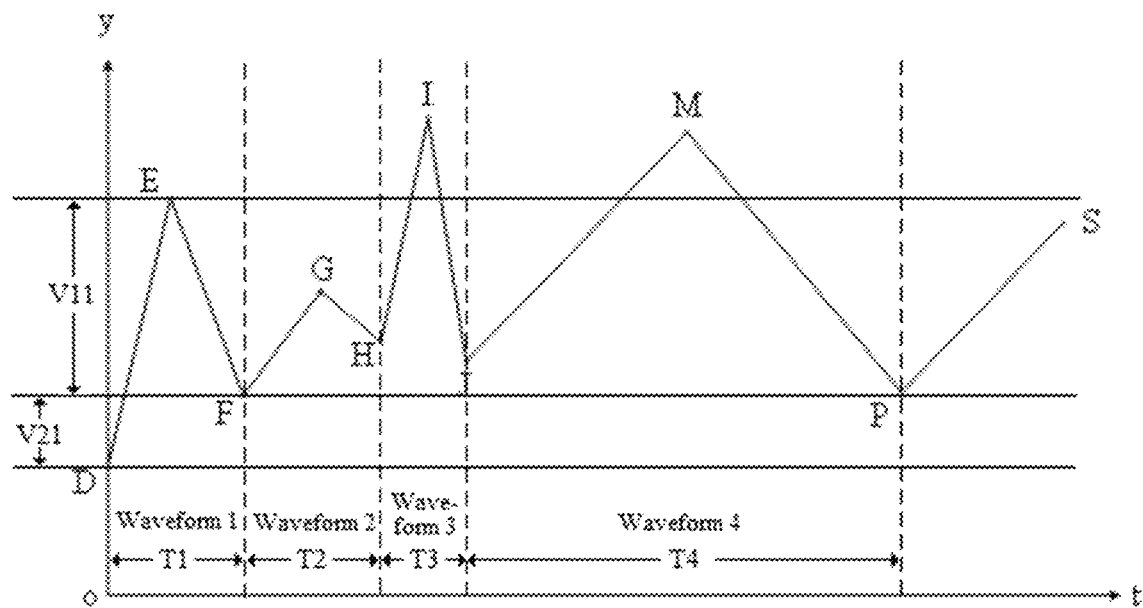
FIG. 7 is a schematic diagram of extracting a time-domain feature according to the present disclosure.

It is required to perform waveform preprocessing based on the time dispersion, the amplitude dispersion, and the number of waveforms in the time-domain feature. The waveform preprocessing is performed by: for each of the original waveforms, eliminating a non-local extreme point of the waveform, and connecting remaining sampling points in sequence to obtain a new waveform. The new waveform includes only local maximum points and local minimum points in the original waveform. FIG. 7 shows waveforms after eliminating non-extreme points based on the above description.

In performing time-domain feature analysis, the calculation of the time dispersion is shown in FIG. 7. Based on the preprocessed waveform, the calculation is performed by dividing a sum of absolute values of time differences between adjacent waveforms by a sum of the time periods. The calculation is performed by using the following equation:

$$\text{Time dispersion} = \frac{|T_2 - T_1| + |T_3 - T_2| + |T_4 - T_3|}{|T_1| + |T_2| + \ldots + |T_4|}$$

As shown in FIG. 7, in the above equation, $T_i$ represents a time interval between two adjacent minimum values, and represents a time length of a waveform unit.

In performing time-domain feature analysis as shown in FIG. 7, the amplitude dispersion is calculated by: dividing a sum of absolute values of amplitude differences of adjacent waveforms by a sum of amplitudes in the segment. The calculation is performed by using the following equation:

$$\text{Amplitude dispersion} = \frac{|V_{FH} - V_{DF}| + |V_{HJ} - V_{FH}| + |V_{JP} - V_{HJ}|}{|V_{DE}| + |V_{FG}| + \ldots + |V_{MP}|}$$

where each of a difference between $V_{FH}$ and $V_{DF}$, a difference between $V_{HJ}$ and $V_{FH}$ and a difference between $V_{HJ}$ and $V_{FH}$ in the numerator represents an amplitude difference between two adjacent minimum points, and each of $V_{DE}$, $V_{FG}$ and $V_{MP}$ in the denominator represents an amplitude difference between a minimum point and a maximum point adjacent to the minimum point.

In an embodiment, it is assumed that y represents a sequence of the new waveform obtained by preprocessing the waveform, then the number N of the waveforms is calculated by using the following equation:

$$N = \left\lfloor \frac{\text{length}(y) - 1}{2} \right\rfloor$$

where length(y) represents a sequence length of the preprocessed waveform, and $\lfloor g \rfloor$ represents a rounding down operation.

The frequency-domain feature is extracted from the filtered signal. Same frequency-domain processing is performed on each of signals outputted from the three filters. The FFT eigenvalues are extracted by performing the following steps 1 to 6.

In step 1, data of each of the 10 ms half-waves filtered by different sub-band filters is divided into 300 segments.

In step 2, a 1024-point FFT transform is performed on data in each of the segments. Assuming that L represents a length of the data in each of the segments, the 1024-point FFT transform is performed on the data in each of the segments for $$M = \left\lfloor \frac{L}{1024} \right\rfloor$$

times.

In step 3, 37 frequency channels are selected from FFT operation results corresponding to two pass-bands, and FFT transform values of M same frequency points in a segment form an M-dimensional eigenvector.

In step 4, median filtering is performed on M-dimensional eigenvectors respectively corresponding to 37 frequency points to obtain 37 median filtered eigenvectors.

In step 5, the median filtered eigenvectors corresponding to 37 frequency points are summed according to the frequency points to obtain eigenvalues corresponding to 37 frequency points in each of the segments.

In step 6, the above operations are performed on each of the 300 segments of each of the half-waves, and eigenvalues of the 300 segments in a same FFT channel form an eigenvector. The eigenvectors corresponding to the 37 frequency points form a 37*300 feature matrix.

Described above are eigenvalues designed and adopted in a preferred embodiment of the present disclosure, and the eigenvalues to be processed by the method for detecting an arc based on the multi-channel two-dimensional convolutional neural network are not limited to the eigenvalues mentioned above.

With the time-domain feature analysis and the frequency-domain feature analysis, multiple eigenvectors may be obtained. Before processing the eigenvectors by using the neural network, it is required to perform normalization on the eigenvectors to eliminate the influence of the dimensions of different eigenvalues. Since each of the half-waves is divided into 300 segments and the obtained eigenvectors are 300-dimensional, normalization is performed on each of the eigenvectors by using the following equation:

$$x[n] = \frac{x[n] - \min(X)}{\max(X) - \min(X)}$$

where x[n] represents an n-th element in the eigenvector, and x[n] represents an element after normalization; X represents the eigenvector; max(X) represents an element with a maximum value in the eigenvector X; and min(X) represents an element with a minimum value in the eigenvector X.

In an embodiment, based on the image processing method by using a convolutional neural network, the eigenvectors after normalization are spliced to obtain a feature matrix in the detection method by using the neural network according to the present disclosure.

Figure 3:
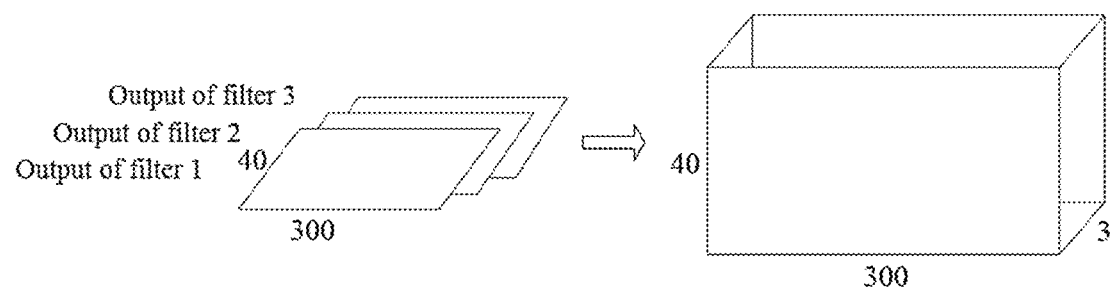
FIG. 3 is a schematic diagram of stacking eigenvectors extracted by different filters to obtain a three-dimensional matrix according to the present disclosure.
Figure 4:
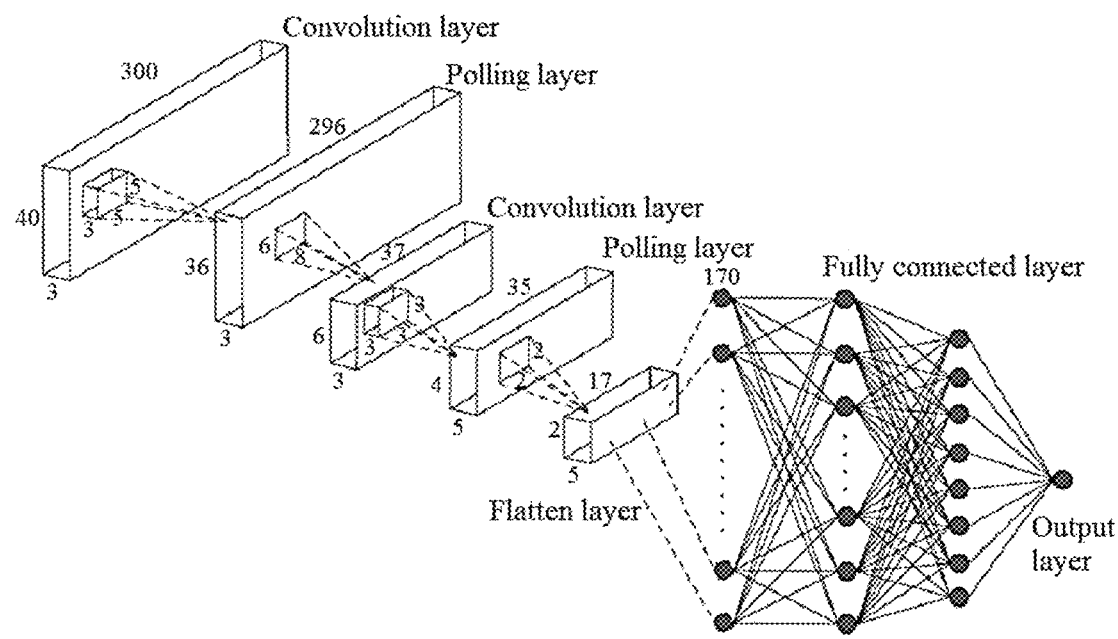
FIG. 4 is a schematic diagram showing a structure and a calculation process of a convolutional neural network according to an embodiment of the present disclosure.

Two-dimensional feature matrices corresponding to different filters are similar to different channels in an image. For each of signals outputted from the filters, 3 time-domain eigenvectors and 37 eigenvectors are extracted, each of the half-waves is divided into 300 segments, and the eigenvectors are spliced to obtain a 40*300 feature matrix. The two-dimensional feature matrices corresponding to the three filters may be stacked. As shown in FIG. 3, three 40*300 matrices are stacked to obtain a 40*300*3 three-dimensional matrix, where 3 indicates the number of channels of the feature matrix.

Figure 2:
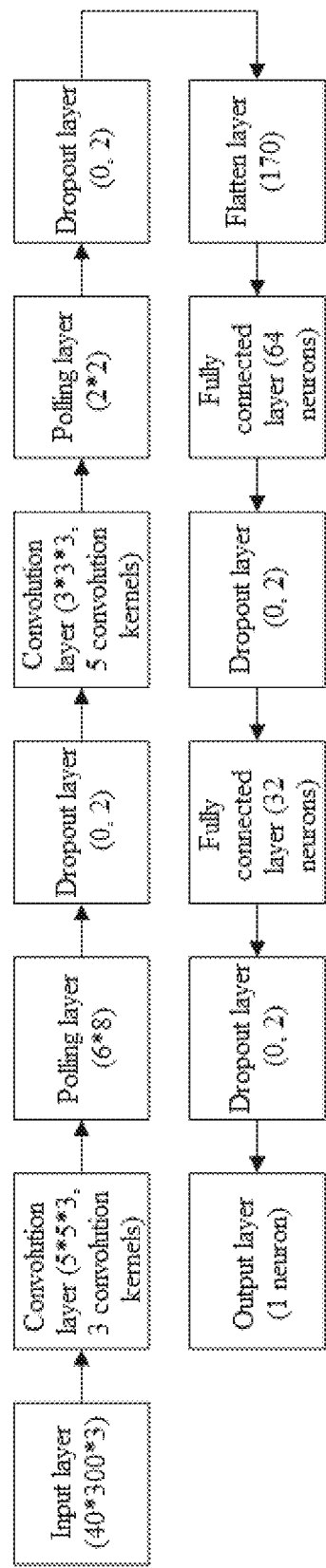
FIG. 2 shows a topology structure of a convolutional neural network model according to the present disclosure.

In the embodiment, a topology structure of the neural network is shown in FIG. 2. With reference to the process of the neural network shown in FIG. 4, the topology structure of the neural network is briefly described in the following steps 1 to 8.

In step 1, a 40*300*3 three-dimensional feature matrix corresponding to each of half-waves is inputted through an input layer, and then is processed by two convolution layers.

In step 2, a first convolution layer has three 5*5*3 convolution kernels, where the number 3 in 5*5*3 indicates that the number of the convolution kernel is same as the number of channels of the inputted feature matrix. Each of the convolution kernels outputs a 36*296 result. The three convolution kernels of the first convolution layer correspond to three channels. Thus, the first convolution layer outputs a 36*296*3 result.

In step 3, a first pooling layer having a 6*8 pooling window performs dimension reduction on the output of the first convolution layer to output a 6*37*3 result.

In step 4, the output of the first pooling layer is inputted to a second convolution layer which has five 3*3*3 convolution kernels, and a 4*35*5 result is outputted.

In step 5, a pooling layer having a 2*2 pooling window performs dimension reduction on the result outputted from the second convolution layer, and output a 2*17*5 result.

In step 6, a Flatten layer stretches the three-dimensional matrix to obtain a one-dimensional vector including 170 elements.

In step 7, the one-dimensional vector is inputted to a fully connected layer having 64 neurons, and then is inputted to a fully connected layer having 32 neurons, and then is inputted to an output layer having one neuron.

In step 8, after the neuron in the output layer perform processing, the output layer outputs a probability value for performing two-class processing to determine whether an arc occurs or no arc occurs.

The Dropout layer in FIG. 2 is mainly used in training to reduce overfitting in training.

In the embodiment, a multi-channel two-dimensional convolution operation is performed. In performing the multi-channel two-dimensional convolution operation, a two-dimensional convolution operation is performed for each of channels, then a convolution result for each of the channels are summed, and then a bias value is added. The calculation is performed by using the following equation:

$$y_n = \sum_{k=1}^{K}\sum_{i=1}^{M}\sum_{j=1}^{N}(x_{i,j,k} g a_{i,j,k}) + b_n$$

where K represents the number of channels, M represents the number of rows of a convolution kernel in each of the channels, N represents the number of columns of the convolution kernel in each of the channels, $y_n$ represents a convolution output result, $b_n$ represents a direct-current bias in a linear operation, $a_{i,j,k}$ represents a weighting coefficient in the linear operation, and $x_{i,j,k}$ represents an originally inputted feature element or an output result of a previous convolution layer.

Figure 5:
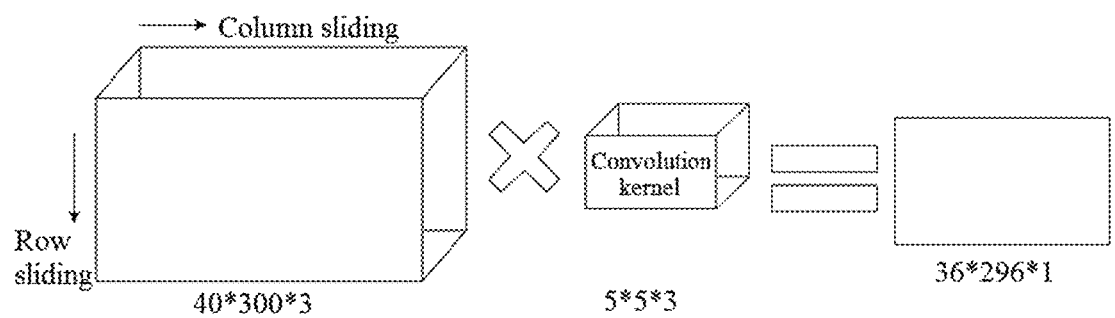
FIG. 5 is a schematic diagram shows a principle of a convolution operation according to an embodiment of the present disclosure.

In the embodiment, the convolution operation is performed with a stride of 1. As shown in FIG. 5, in performing a next convolution operation, a row sliding is performed on the matrix inputted to the convolution layer according to the stride. First, the row is fixed, and a column sliding is performed until sliding to the end of the column, and then a row sliding is performed along the direction of the row according to the stride. It is assumed that an original matrix is an A*B*K matrix, where K represents the number of channels in the data matrix. A convolution operation with an M*N*K convolution kernel is performed, then a (A−M+1)*(B−N+1) result is outputted. The number of the channels of the convolution operation result is determined by the number of the convolution kernels.

Figure 6:
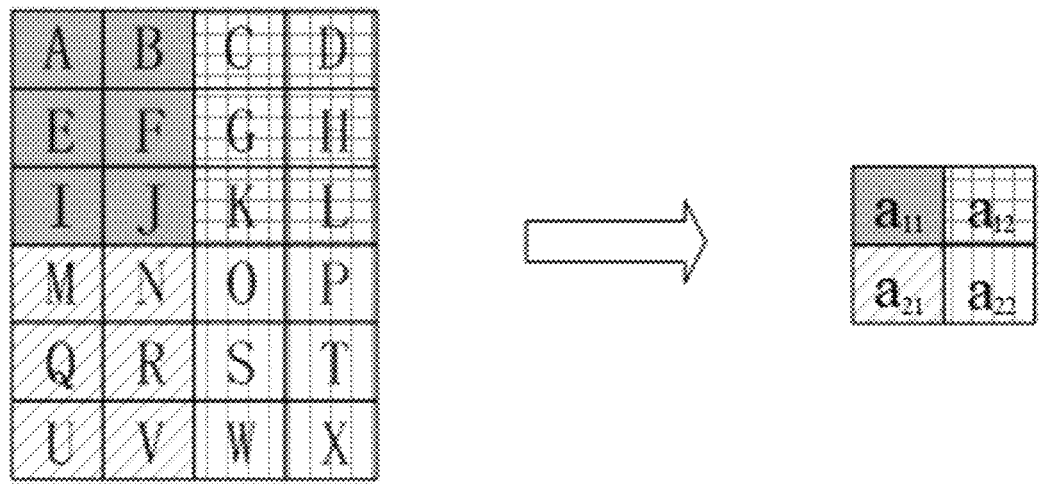
FIG. 6 is a schematic diagram shows a principle of a pooling operation according to an embodiment of the present disclosure.

In the embodiment, dimensionality reduction is performed on the convolution result by using a pooling layer, a MaxPooling2D pooling layer is used. As shown in FIG. 6, it is assumed that a convolution result has a 6*4 channel matrix and a 3*2 pooling window is used in the pooling process, the pooling process is performed by using the following equations:

$$\begin{cases} a_{11} = \max(A, B, E, F, I, J) \\ a_{12} = \max(C, D, G, H, K, L) \\ a_{21} = \max(M, N, Q, R, U, V) \\ a_{22} = \max(O, P, S, T, W, X) \end{cases}$$

Thus, the pooling process outputs a 2*2 result. During the pooling process, adjacent pooling operation windows do not overlap with each other.

In the embodiment, the outputs by the neurons in the fully connected layers and the output layer are obtained by using the following calculation:

$$y_n = \sum_{i=1}^{N} a_i g x_i + b_n$$

where $y_n$ represents an output of the fully connected layer or the output layer after performing a linear operation, $x_i$ represents a weighting coefficient for operations in the fully connected layer or the output layer, $x_i$ represents an input to the fully connected layer or the output layer, and $b_n$ represents a direct current bias in the linear operation.

N is 170 for the calculation of the neuron in a first fully connected layer. N is 64 for the calculation of the neuron in the second fully connected layer. N is 32 for the calculation of the neuron in the output layer.

In the embodiment, the convolution layers and the fully connected layers adopt a ReLu activation function, which is expressed as:

$$\text{relu}(x) = \max(0, x)$$

where x represents a weighted sum result after convolution operations or a weighted sum result after processing by the fully connected layer.

In the embodiment, the output layer adopts a sigmoid function, which is expressed as:

$$\text{sigmoid}(x) = \frac{1}{1 + e^{-x}}$$

where x represents a weighted sum result of a last fully connected layer. A result outputted by the output layer ranges from 0 and 1, which represents a probability of a classification result being 0 or 1.

In the embodiment, a result outputted by an activation function of the output layer is classified based on a threshold of 0.5, which is expressed as:

$$y = \begin{cases} 0, & \text{sigmoid}(x) > 0.5 \\ 1, & \text{sigmoid}(x) < 0.5 \end{cases}$$

where x represents an output of a neuron in the output layer; and y represents a determination result of a half-wave, where that the half-wave is a normal half-wave in a case that y=0, and the half-wave is determined as a fault arc half-wave in a case that y=1.

Figure 8:
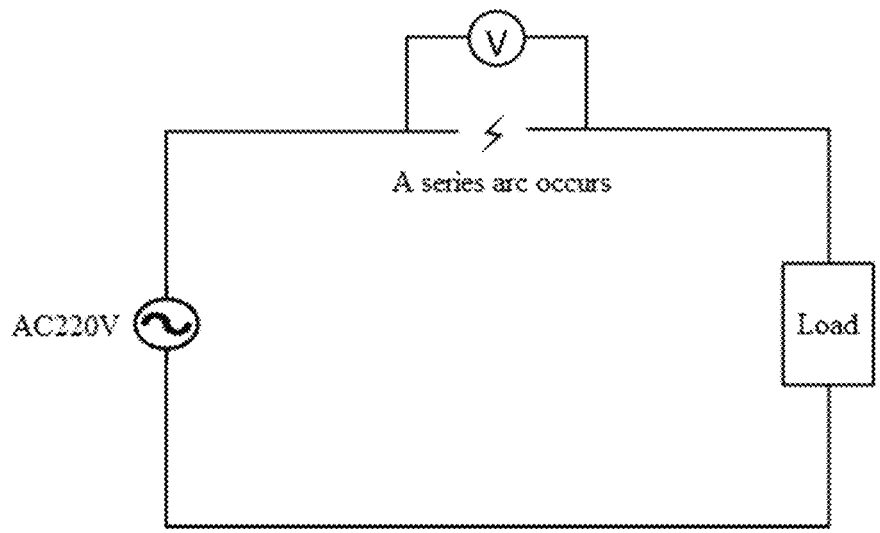
FIG. 8 is a schematic diagram of measuring a voltage at a position at which a series arc occurs according to the present disclosure.
Figure 10:
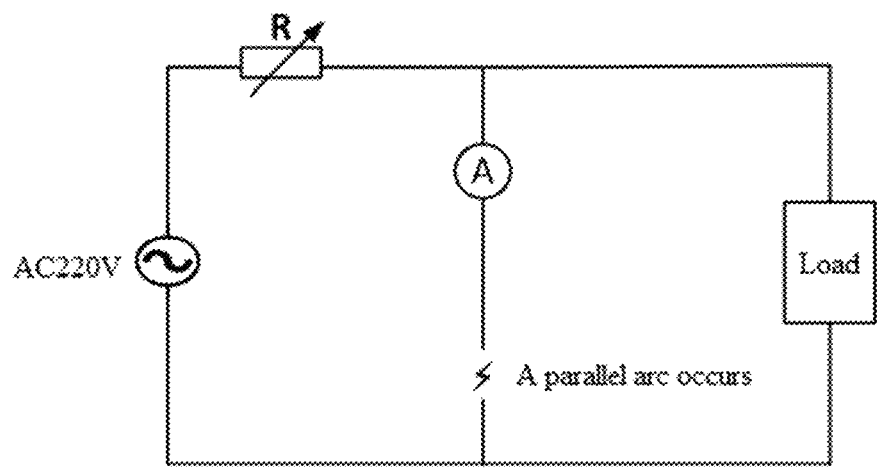
FIG. 10 is a schematic diagram of measuring a current at a position at which a parallel arc occurs according to the present disclosure.

In the detection method, before the neural network model is used for determination, it is required to train the neural network model offline based on training data to obtain and save a model with best performance. Then, online determination is performed on the obtained feature matrix by using the trained model. In collecting data in a laboratory, there may be a case in which data is labeled as arcing data while no arc occurs on an arc generator or a carbonized cable, thus it is required to clean and eliminate data before the data is provided to the neural network for training. According to the present disclosure, a voltage at a position at which a series fault arc occurs and a current at a position at which a parallel fault arc occurs are measured to determine whether the collected experimental data indicates an arcing occurs. FIG. 8 and FIG. 10 show the circuits.

Figure 9:
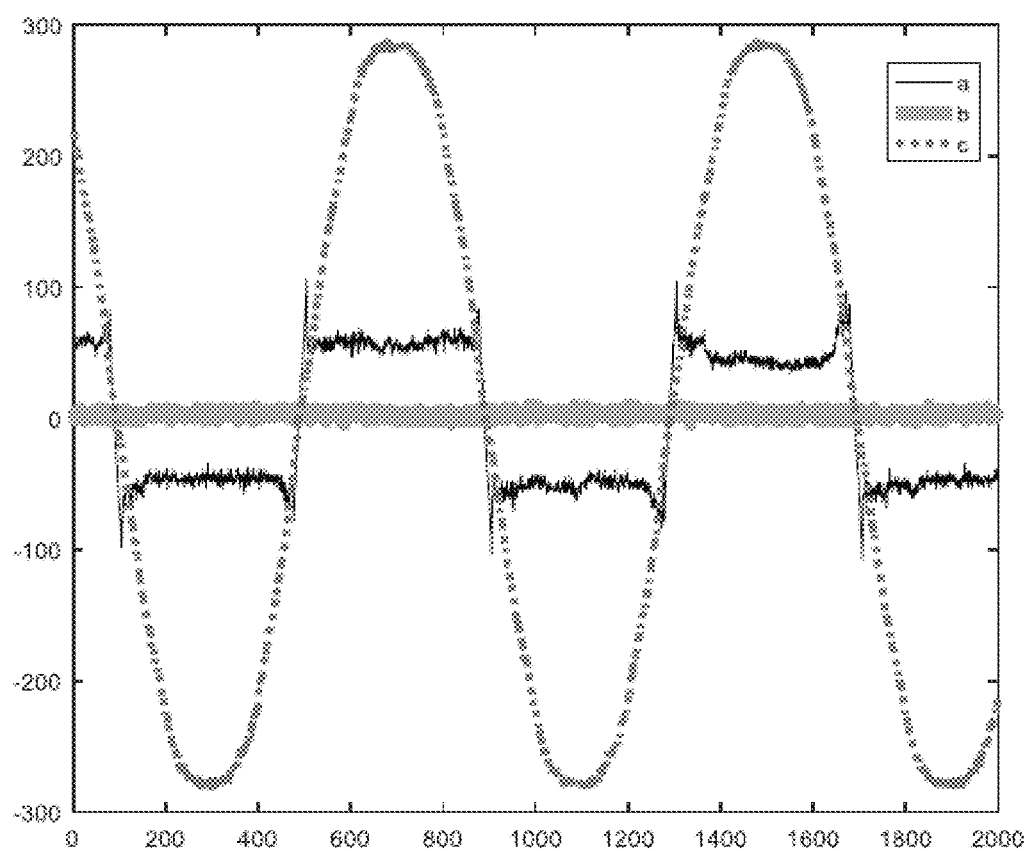
FIG. 9 shows a waveform of a voltage measured at a position at which a series arc occurs according to the present disclosure

In the series arc experiment, there are two cases in which there is no arcing. In one case, an iron rod in the arc generator is completely separated from a carbon rod in the arc generator, or two wires in the carbonized cable are separated from each other. In this case, the voltage across the arc generator or the carbonized cable is a standard line voltage, as shown by line c in FIG. 9. In the other case, an iron rod in the arc generator is in complete contact with a carbon rod in the arc generator, or two wires in the carbonized cable are connected to each other. In this case, the voltage across the arc generator or the carbonized cable fluctuates within a small range around zero, as shown by line b in FIG. 9. When an arc occurs, the voltage is lower than the standard line voltage and is seriously distorted, as shown by line a in FIG. 9. Therefore, the experimental data mislabeled as arcing data may be eliminated based on a waveform of the measured voltage.

Figure 11:
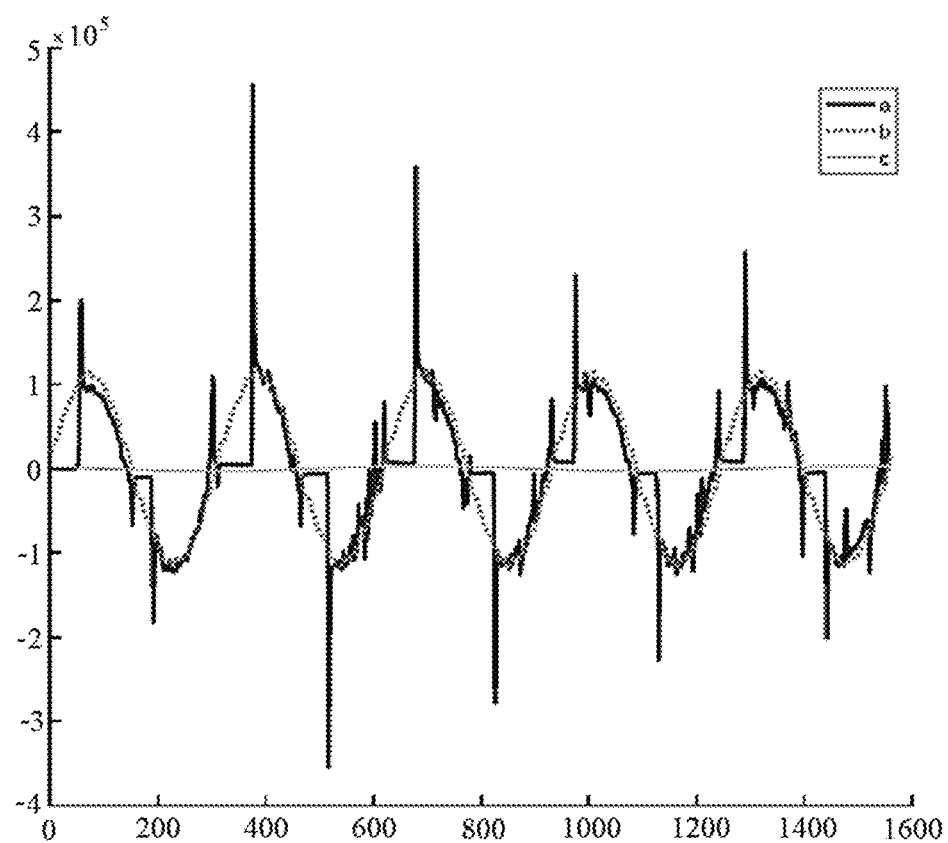
FIG. 11 shows a waveform of a current measured at a position at which a parallel arc occurs according to the present disclosure.

In the parallel arc experiment, there are two cases in which there is no arcing. In one case, two wires in the cable are separated from each other, and a current at a position at which the arc occurs is close to zero, as shown by line c in FIG. 11. In the other case, two wires in the cable are short-circuited, and a current at a position at which the arc occurs is very large, as shown by line b in FIG. 11. When an arc occurs, the current is less than a line conduction current and there is a flat shoulder feature which is an arc symbolic feature, as shown in line a in FIG. 11. Due to the short acquisition time period for the parallel arc, an arc may be determined by manually checking whether the current has a flat shoulder feature.

In an embodiment, a breaking time of a circuit breaker varies with a current. Therefore, in addition to perform determination on the half-wave, it is required to perform determination on all half-waves in the observation time period $\Delta T$ by using the neural network, and it is determined whether to perform a tripping operation based on a determination result of the half-waves in the observation time period.

In an embodiment, the determination is performed by performing the following steps 1 to 4.

In step 1, an observation time period $\Delta T$ and a fault half-wave number threshold in the observation time period are determined by querying a table based on a calculated measurement current.

In step 2, half-waves in the $\Delta T$ are detected and determined by using detection method based on the neural network, determination results are outputted, and a determination result vector is obtained based on the determination results.

In step 3, elements in the determination result vector are summed up to obtain the number of fault half-waves in the observation time period. The calculation is performed by using the following equation:

$$N = \sum_{i=1}^{\lceil \Delta T/10 \rceil} y_i$$

where $y_i$ represents a determination result of an i-th half-wave in the observation time period, a determination result equal to 0 indicates that the half-wave is a normal half-wave, and a determination result of equal to 1 indicates that an arcing occurs; $\lceil \Delta T/10 \rceil$ represents the number of half-waves in the observation time period $\Delta T$, and $\lceil g \rceil$ presents a rounding up operation.

In step 4, the number of the half-waves in the observation time period ΔT obtained above is compared with a threshold to determine whether to perform a tripping operation.

Compared with the conventional method in which a single eigenvalue is obtained and then the single eigenvalue is compared with a threshold to determine a half-wave is a fault arc half-wave, with the method based on a convolutional neural network according to the present disclosure, a higher accuracy and higher reliability can be achieved in identifying a fault arc half-wave, and adaptability can be achieved in performing training for different load conditions.

Described above are only specific embodiments of the present disclosure, and the protection scope of the present disclosure is not limited thereto. Various modifications or substitutions equivalent to the embodiments can be easily made by those skilled in the art within the technical scope disclosed by the present disclosure. These modifications or substitutions should fall within the protection scope of the present disclosure. Therefore, the protection scope of the present disclosure should be subject to the protection scope defined in the claims.

The invention claimed is:

1. A method for detecting a fault arc signal by using a convolutional neural network, comprising:
   S1, filtering, by using three band-pass filters with different pass-bands, a sampled current signal to extract time-frequency eigenvectors;
   S2, constructing a three-dimensional matrix based on the time-frequency eigenvectors;
   S3, constructing a two-dimensional convolutional neural network model, and training the two-dimensional convolutional neural network model;
   S4, performing, by using the trained two-dimensional convolutional neural network model, an online determination on the three-dimensional matrix to obtain an arc detection result, wherein an arc detection result of 0 indicates that no arcing occurs, and an arc detection result of 1 indicates that an arcing occurs;
   S5, counting the number of fault half-waves in an observation time period ΔT based on the arc detection result; and
   S6, comparing the number of the fault half-waves in the observation time period ΔT with a threshold, performing a tripping operation in a case that the number of the fault half-waves exceeds the threshold, and performing no operation in a case that the number of the fault half-waves does not exceed the threshold.

2. The method for detecting a fault arc signal according to claim 1, wherein
   each of the time-frequency eigenvectors comprises a time-domain feature and a frequency-domain feature, and the time-domain feature comprises a time dispersion, an amplitude dispersion and the number of waveforms; and
   the method for detecting a fault arc signal further comprises:
      in a time domain, for each of the waveforms, preprocessing the waveform, eliminating a non-local extreme point of the waveform, connecting remaining sampling points sequentially to obtain a new waveform, and extracting a time-domain feature based on the new waveform; and
      in a frequency domain, performing FFT transform to extract a frequency-domain feature at each of frequency points.

3. The method for detecting a fault arc signal according to claim 1, wherein the pass-bands of the three band-pass filters respectively range from 500 KHZ to 50 MHZ, from 50 MHZ to 100 MHZ, and from 100 MHZ to 200 MHZ, wherein 40 300-dimensional time-frequency eigenvectors are extracted in each of the pass-bands.

4. The method for detecting a fault arc signal according to claim 3, wherein the S2 further comprises:
   stacking three 40*300 feature matrices respectively corresponding to the pass-bands of the three band-pass filters to construct a 40*300*3 three-dimensional feature matrix.

5. The method for detecting a fault arc signal according to claim 3, further comprising:
   performing normalization on each of the 300-dimensional time-frequency eigenvectors to eliminate influences of dimensions of different eigenvalues, wherein the normalization is performed by using the following equation:

$$x[n] = \frac{x[n] - \min(X)}{\max(X) - \min(X)}$$

where x[n] represents an n-th element in the eigenvector, and x[n] represents an element after normalization; X represents the eigenvector; max(X) represents an element with a maximum value in the eigenvector X; and min(X) represents an element with a minimum value in the eigenvector X.

6. The method for detecting a fault arc signal according to claim 1, wherein a structure of the two-dimensional convolutional neural network model comprises:
   an input layer with a dimension of 40*300*3;
   two convolution layers respectively with a 5*5*3 convolution kernel and a 3*3*3 convolution kernel;
   two pooling layers respectively with a 6*8 pooling window and a 2*2 pooling window;
   two fully connected layers respectively having 64 neurons and 32 neurons; and
   an output layer containing a neuron.

7. The method for detecting a fault arc signal according to claim 6, wherein
   the convolution layers and the fully connected layers adopt a ReLu activation function, which is expressed as:

$$\text{relu}(x) = \max(0, x);$$

the output layer adopts a sigmoid activation function, which is expressed as $$\text{sigmoid}(x) = \frac{1}{1 + e^{-x}}; \text{ and}$$

the output layer outputs a probability value ranging from 0 and 1 by using the sigmoid activation function, and a half-wave is determined as a normal half-wave or a fault arc based on the probability value.

8. The method for detecting a fault arc signal according to claim 1, wherein the training the two-dimensional convolutional neural network model comprises:
   measuring a voltage at a position at which an arc occurs in a series arc experiment and a current at a position at which an arc occurs in a parallel arc experiment;

eliminating mislabeled data based on the measured voltage and the measured current to obtain correctly labeled data; and training the two-dimensional convolutional neural network model by using the correctly labeled data.

9. The method for detecting a fault arc signal according to claim 1, further comprising:

determining the observation time period $\Delta T$ and a half-wave number threshold of a fault arc by querying a table based on a measurement current; and the S6 further comprises:

summing vectors formed by the arc detection result, and calculating the number of the fault half-waves in the observation time period $\Delta T$.

* * * * *